United States Patent
Hirschbold et al.

(12)

(10) Patent No.: US 6,186,842 B1
(45) Date of Patent: Feb. 13, 2001

(54) REVENUE METER BAYONET ASSEMBLY AND METHOD OF ATTACHMENT

(75) Inventors: Markus F. Hirschbold; Peter C. Cowan, both of British Columbia (CA)

(73) Assignee: Power Measurement Ltd., British Columbia (CA)

( * ) Notice: Under 35 U.S.C. 154(b), the term of this patent shall be extended for 0 days.

(21) Appl. No.: 09/370,686

(22) Filed: Aug. 9, 1999

(51) Int. Cl.⁷ ..................................................... H01R 4/02
(52) U.S. Cl. ........................ 439/876; 361/664; 228/180.1
(58) Field of Search .................. 439/876, 83; 228/180.1; 174/267, 262, 265, 266; 361/760, 772, 773, 774, 775, 807, 809, 811, 748, 664, 665, 667–71

(56) References Cited

U.S. PATENT DOCUMENTS

| | | |
|---|---|---|
| Re. 31,774 | 12/1984 | Fletcher et al. . |
| 3,334,275 * | 8/1967 | Mandeville ............................. 361/730 |
| 4,077,061 | 2/1978 | Johnston et al. . |
| 4,156,280 | 5/1979 | Griess . |
| 4,240,149 | 12/1980 | Fletcher et al. . |
| 4,345,311 | 8/1982 | Fielden . |
| 4,365,302 | 12/1982 | Elms . |
| 4,388,611 | 6/1983 | Haferd . |
| 4,455,612 | 6/1984 | Girgis et al. . |
| 4,459,546 | 7/1984 | Arrington et al. . |
| 4,463,311 | 7/1984 | Kobayashi . |
| 4,568,934 | 2/1986 | Allgood . |
| 4,612,617 | 9/1986 | Laplace, Jr. et al. . |
| 4,642,564 | 2/1987 | Hurley . |
| 4,663,587 | 5/1987 | Mackenzie . |
| 4,672,555 | 6/1987 | Hart et al. . |
| 4,715,000 | 12/1987 | Premerlani . |
| 4,783,748 | 11/1988 | Swarztrauber et al. . |
| 4,793,058 * | 12/1988 | Venaleck ................................. 29/845 |

(List continued on next page.)

OTHER PUBLICATIONS

"QUAD4® Plus and MAXsys™ Multifunction Electronic Meters and IEDS," On–Line User Guide, *QUAD4 Plus/MAXsys Products User's Guide*, Rev. 1.01, pp. 1–1, 1–4; 1–13–1–15; 4–100, 4–107–4–108.

"QUAD4® Plus and MAXsys™ Multifunction Electronic Meters and IEDS", On–Line User Guide Product Definitions, *QUAD4 Plus/MAXsys Products User's Guide*, Rev 1.01, pp. DEF–1–DEF–13.

"Protective Relaying Theory and Applications," edited by Walter A. Elmore, pp. 17–37 (1994).

"The world is changing. The old answers no longer apply," *Schlumberger*, Bulletin.

"Series PM170 Powermeters," *SATEC*, Bulletin.

"System 270 Powermeter," *SATEC*, Bulletin.

"RPM090 Digital Transducer," *SATEC*, Bulletin.

"Series 290 Power Monitoring System," *SATEC*, Bulletin.

"PM290HD Powermeter With Harmonic Analysis," *SATEC*, Bulletin.

"AX–7 Analog Expander," *SATEC*, Bulletin.

"Application Software, Professional Systems For Energy Control And Management," *SATEC*, Bulletin.

"Power Monitoring And Analysis Systems," *SATEC*, Bulletin.

(List continued on next page.)

*Primary Examiner*—Khiem Nguyen
*Assistant Examiner*—Brian S. Webb
(74) *Attorney, Agent, or Firm*—Brinks Hofer Gilson & Lione

(57) ABSTRACT

A method and arrangement are disclosed for attaching one or more electrical bayonet-type blades to a circuit board. The arrangement comprises a circuit board with at least one opening adapted to receive one blade. A solder pad disposed on at least one surface of board surrounds the opening. A plurality of vias surround the opening. The vias are disposed such that they pass through the solder pad. Solder is applied around the electrically conducting bayonet on one surface of the circuit board, through the vias, and around the electrically conducting bayonet of the surface of the circuit board opposite to the solder pad.

48 Claims, 7 Drawing Sheets

U.S. PATENT DOCUMENTS

| | | |
|---|---|---|
| 4,794,369 | 12/1988 | Haferd . |
| 4,837,504 | 6/1989 | Baer et al. . |
| 4,839,819 | 6/1989 | Begin et al. . |
| 4,878,142 | 10/1989 | Bergman et al. . |
| 4,878,185 | 10/1989 | Brand et al. . |
| 4,884,021 | 11/1989 | Hammond et al. . |
| 4,901,221 | 2/1990 | Kodosky et al. . |
| 4,914,568 | 4/1990 | Kodosky et al. . |
| 4,979,122 | 12/1990 | Davis et al. . |
| 5,000,691 * | 3/1991 | Olsson et al. .......................... 439/83 |
| 5,017,860 | 5/1991 | Germer et al. . |
| 5,059,896 | 10/1991 | Germer et al. . |
| 5,061,890 | 10/1991 | Langini . |
| 5,081,413 | 1/1992 | Yamada et al. . |
| 5,122,735 | 6/1992 | Porter et al. . |
| 5,132,610 | 7/1992 | Ying-chang . |
| 5,151,866 | 9/1992 | Glaser et al. . |
| 5,155,836 | 10/1992 | Jordan et al. . |
| 5,212,441 | 5/1993 | McEachern et al. . |
| 5,224,011 | 6/1993 | Yalla et al. . |
| 5,224,054 | 6/1993 | Wallis . |
| 5,233,538 | 8/1993 | Wallis . |
| 5,243,536 | 9/1993 | Bradford . |
| 5,243,537 | 9/1993 | Neumann . |
| 5,245,275 | 9/1993 | Germer et al. . |
| 5,247,454 | 9/1993 | Farrington et al. . |
| 5,258,704 | 11/1993 | Germer et al. . |
| 5,262,715 | 11/1993 | King et al. . |
| 5,270,640 | 12/1993 | Kohler et al. . |
| 5,301,121 | 4/1994 | Garverich et al. . |
| 5,391,983 | 2/1995 | Lusigman et al. . |
| 5,414,812 | 5/1995 | Filip et al. . |
| 5,426,780 | 6/1995 | Gerull et al. . |
| 5,481,700 | 1/1996 | Thuraisingham . |
| 5,498,956 | 3/1996 | Kinney et al. . |
| 5,537,029 | 7/1996 | Hemminger et al. . |
| 5,548,527 | 8/1996 | Hemminger et al. . |
| 5,549,089 | 8/1996 | Snell et al. . |
| 5,555,508 | 9/1996 | Munday et al. . |
| 5,626,278 * | 5/1997 | Tang ..................................... 228/56.3 |
| 5,627,759 | 5/1997 | Bearden et al. . |
| 5,631,843 | 5/1997 | Munday et al. . |
| 5,650,936 | 7/1997 | Loucks et al. . |
| 5,736,847 | 4/1998 | Van Doorn et al. . |
| 5,828,576 | 10/1998 | Loucks et al. . |
| 6,011,222 * | 1/2000 | Sekiya et al. ......................... 174/266 |

OTHER PUBLICATIONS

"PM–295 Powermeter / Harmonic Analyzer," *SATEC*, Bulletin.
"PM 295 Power Monitoring System with Harmonic Analysis," *SATEC*, Bulletin.
"PM 170M Powermeter—with KVA Measurements," *SATEC*, Bulletin.
"Vector Electricity Meter with the Site Genie™ Monitor," *General Electric*.
"VECTRON® SVX Solid–State Polyphase Meters," *Schlumberger*, Bulletin 11314 (Mar. 1996).
"MAXsys® 2510 Substation/High–End Direct Access Meter," *Siemens*, Bulletin.
"MAXsys® 2410 Direct Access Meter," *Siemens*, Bulletin.
"AIN ALPHA® Meter For IEC Standards," *ABB Information Systems*, Bulletin.
"ALPHA Stars™, National Wireless Communications for Remote Metering," *ABB Information Systems*, Bulletin.
"AIN Alpha, High Function Multi–Tariff Solid State Electricity Meter," *ABB Network Partner*, PB 42–280–lb, pp. 1–20.
"MARK–V Digital True RMS Energy Meter," *TransData, Inc.*, Bulletin.
"MAXsys®—PSI," *Siemens*, Bulletin.
"MeterView® Software Environment . . . , . . . Instant Access to Maxsys® Meter Information," *Siemens*, D00024D (1997).
"MAXsys®—Multi–Access Metering And Control," *Siemens*, Bulletin.
"MAXsys® For Energy Providers," *Siemens*, Bulletin.
QUAD® Plus and MAXsys® Meters and IEDs, *Siemens, QUAD2DSQ* (1998).
QUAD4® Plus Solid–State Meter, *PSI*, Bulletin.
"kV Telephone Modem," *General Electric*, Bulletin.
"kV A–base Meters," *General Electric*, Bulletin.
"kV Class 320 Meters," *General Electric*, Bulletin.
"EnergyAxis™ Customer Site Metering System For On–Site Metering and Power Analysis,", *ABB Information Systems*, Bulletin (1998).
"8500 ION®·Direct Access Billing Meter," *8500 ION™*, Power Measurement, Bulletin (Aug. 11, 1998).
"7700 ION® 3–Phase Power Meter, Analyzer and Controller," *7700 ION™*, Power Measurement, Bulletin (Apr. 22, 1998).
"American National Standard for Electric Meters—Code for Electricity Metering," *American National Standard*, Document ANSI C12.1 (1995).
"American National Standard for Electromechanical Watthour Meters," *The Institute of Electrical and Electronics Engineers, Inc.*, ANSI C12 (1987) (Revision of ANSI C12–10–1987).
"American National Standard for Electronic Time–of–Use Registers for Electricity Meters," *The Institute of Electrical and Electronics Engineers, Inc.*, ANSI C12 (Revision of ANSI C12 13–1985) (1991).
"American National Standard for Solid–State Electricity Meters," *The Institute of Electrical and Electronics Engineers, Inc.*, ANSI C12.16 (1991).
"American National Standard for Electricity Meters 0.2 and 0.5 Accuracy Classes," *American National Standards*, ANSI C12.20 (1998).
"ISO—Specification MTR1–96, Engineering Specification For Polyphase Solid–State Electricity Meters For Use On The ISO Grid," Exhibit A, pp. 1–42 (1997).
"Specifications For Approval Of Type of Electricity Meters, Instrument Transformers And Auxiliary Devices," *Consumer and Corporate Affairs Canada*.
International Standard, Alternating current static watt–hour meters for active energy (classes 0,2 S and 0,5 S), *International Electrotechnical Commission*, second edition (1992).
"Meter–Mounting Devices, Industrial Products," Canadian Standards Association, C22.2 No. 115–M (1989).
"Alternating–Current Electricity Metering, Electric Power Systems and Equipment," *Canadian Standards Association*, CAN3–C17–M (1984).
International Standard, Amendment 1 to Publication 868 (1986), *International Electrotechnical Commission*, Modification 1 (1986).
"International Standard, Electromagnetic Compatibility (EMC)—Part 4: Testing and measurement techniques—Section 15: Flickermeter—Functional and design specifications," *International Electrotechnical Commission*, 61000 4–15 (1997).
"Measurement Guide for Voltage Characteristics—Electricity Product Characteristics and Electromagnetic Compatibility," 230.02 *Norcomp, Unipede* (1995).
"Voltage characteristics of electricity supplied by public distribution systems," *BSI Standards*, 50160 (1995).
"Minutes of the 7th Meeting, Distribution Committee," *EEI*, 1998.

* cited by examiner

REVENUE METER BAYONET ASSEMBLY AND METHOD OF ATTACHMENT

RELATED APPLICATIONS

The following co-pending and commonly assigned U.S. patent applications have been filed on the same date as the present application. All of these applications relate to and further describe other aspects of the embodiments disclosed in the present application and are all herein incorporated by reference.

U.S. patent application Ser. No. 09/370,317, "REVENUE METER WITH POWER QUALITY FEATURES", (Attorney Ref. No. 06270/22), filed Aug. 9, 1999.

U.S. patent application Ser. No. 09/731,883, "A-BASE REVENUE METER WITH POWER QUALITY FEATURES", (Attorney Ref. No. 06270/32), filed Aug. 9, 1999.

U.S. patent application Ser. No. 09/370,695, "REVENUE METER WITH A GRAPHIC USER INTERFACE", (Attorney Ref. No. 06270/23), filed Aug. 9, 1999.

U.S. patent application Ser. No. 09/370,865, "A POWER SYSTEM TIME SYNCHRONIZATION DEVICE AND METHOD FOR SEQUENCE OF EVENT RECORDING", (Attorney Ref. No. 06270/24), filed Aug. 9, 1999.

U.S. patent application Ser. No. 09/369,870, "METHOD AND APPARATUS FOR AUTOMATICALLY CONTROLLED GAIN SWITCHING OF POWER MONITORS", (Attorney Ref. No. 06270/27), filed Aug. 9, 1999.

U.S. patent application Ser. No. 09/370,696, "EXTERNAL COMMUNICATIONS INTERFACE FOR A REVENUE METER", (Attorney Ref. No. 06270/26), filed Aug. 9, 1999.

U.S. patent application Ser. No. 09/370,757, "A KEYPAD FOR A REVENUE METER", (Attorney Ref. No. 06270/34), filed Aug. 9, 1999.

BACKGROUND OF THE INVENTION

This invention relates to a connector for a circuit board and more particularly to a connector for a circuit board used in electrical meters, for example, revenue meters of the type used by energy suppliers to accurately measure electrical energy delivered to customers for the purposes of billing and/or collecting revenue, and power quality meters having power quality monitoring, detection, quantification and reporting capabilities.

In a typical electrical distribution system, electrical energy is generated by an electrical supplier or utility company and distributed to customers via a power distribution network. The power distribution network is the network of electrical distribution wires which link the electrical supplier to its customers. Typically, electricity from a utility is fed from a primary substation over a distribution cable to several local substations. At the substations, the supply is transformed by distribution transformers from a relatively high voltage on the distributor cable to a lower voltage at which it is supplied to the end customer. From the substations, the power is provided to industrial users over a distributed power network that supplies power to various loads. Such loads may include, for example, various power machines.

At the customer's facility, there will typically be an electrical energy meter ("revenue meter") connected between the customer and the power distribution network so as to measure the customer's electrical demand. The revenue meter is an electrical energy measurement device, which accurately measures the amount of electrical energy flowing to the customer from the supplier or from the customer to the supplier. The amount of electrical energy measured by the meter is then used to determine the amount for which the energy supplier should be compensated. Typically, revenue meters are socket-based meters. That is, revenue meters will generally be of an A-base or S-base meter, as described in more detail below. Alternatively, revenue meters may also be of the switchboard type, as described in more detail below.

The ANSI standards define two general types of revenue meters, socket based ("S-base" or "Type S") and bottom connected ("A-base" or "Type A"). These types of revenue meters are distinguished by the method by which they are connected to the electric circuit that they are monitoring. This invention pertains to S-base meters. S-base meters feature electrically-conducting bayonets (blade type terminals) disposed on back side of the meter. These electrically-conducting bayonets are designed to align with matching jaws of a detachable meter mounting device such as a revenue meter socket. The socket is hard wired to the electrical circuit and is intended to be installed in a permanent manner. To install an S-base meter, the utility need only plug in the meter into the socket. This makes installation of new meters and especially replacement of defective meters extremely simple. Once installed, the installer need only secure the sealing means, which ensure that the meter will not be tampered with (as detailed in the ANSI standards). To remove the meter, the installer need only pull it out of the socket.

The relevant ANSI standards specify the exact physical and electrical requirements of the blade terminals for the S-base meter. Further, these standards also specify requirements common to both types of meters. These include durability and operating lifetime requirements. They further include requirements for physically sealing the meters. Revenue meters must provide sealing mechanisms to both protect the meter from environmental conditions existing in the installed location as well as protect the meter from unauthorized tampering. Typically, revenue meters are contained entirely within a housing which features a meter cover usually made of a transparent material. Typically, this includes the meter electronics, voltage transformer (PT), current transformer (CT), meter display and user interface as specified by the ANSI standards. It should be noted however, that in certain high voltage applications, other CT and PT's can be located remote from the revenue meter and connected with the meter's internal CT and PT's via the S-base or A-base connection in order to isolate dangerous high voltage signals from the meter. For a more detailed description of revenue meters, the reader is referred to the co-pending applications referred to in the first paragraph of this disclosure, which are all incorporated herein by reference.

The present invention simplifies the assembly of the connector between the bayonets or blades and the circuit board. That is, prior to this invention, electrically conducting bayonets were traditionally held in place by cotter pins. A wire harness which was soldered to each individual bayonet was used to connect the bayonets to the measuring circuitry of the meter. Inserting the cotter pins and soldering the wiring harness to the individual bayonets is time consuming since it introduces additional manufacturing steps.

Therefore, it is an object of the present invention to simplify the manufacturing process for attaching bayonets to an S-type revenue meter base by soldering the bayonets directly into a printed circuit board, mounting the printed circuit board on the base, thereby eliminating the need for cotter pins and a wiring harness.

SUMMARY OF THE INVENTION

Accordingly, the present invention provides a method and apparatus for attaching one or more electrical bayonet-type blades to a circuit board. The arrangement comprises a circuit board with at least one opening adapted to receive one blade. Preferably, a solder pad is disposed on at least one surface of the board and surrounds the opening. A plurality of vias surround the opening. In the embodiment using the soldering pad, the vias are arranged within the solder pad. Solder is applied around the electrically conducting bayonet on one surface of the circuit board, through the vias, and around the electrically conducting bayonet to the opposite surface of the circuit board.

This method can be used to fabricate a connection device using fewer manufacturing steps.

DETAILED DESCRIPTION OF THE INVENTION

Overview

Figure 5:
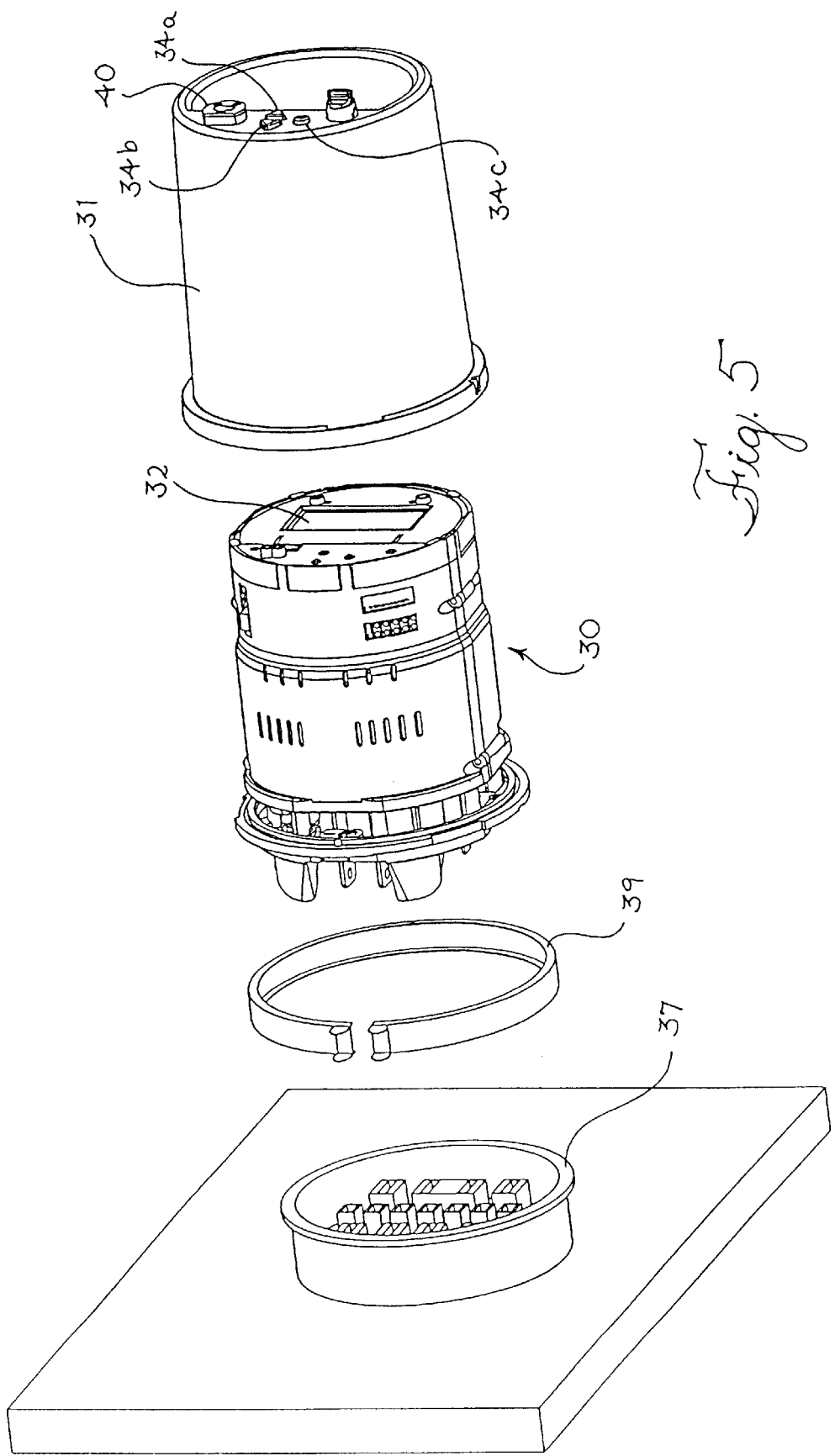
FIG. 5 shows a revenue meter incorporating a circuit board using the connector device of the present invention.
Figure 6:
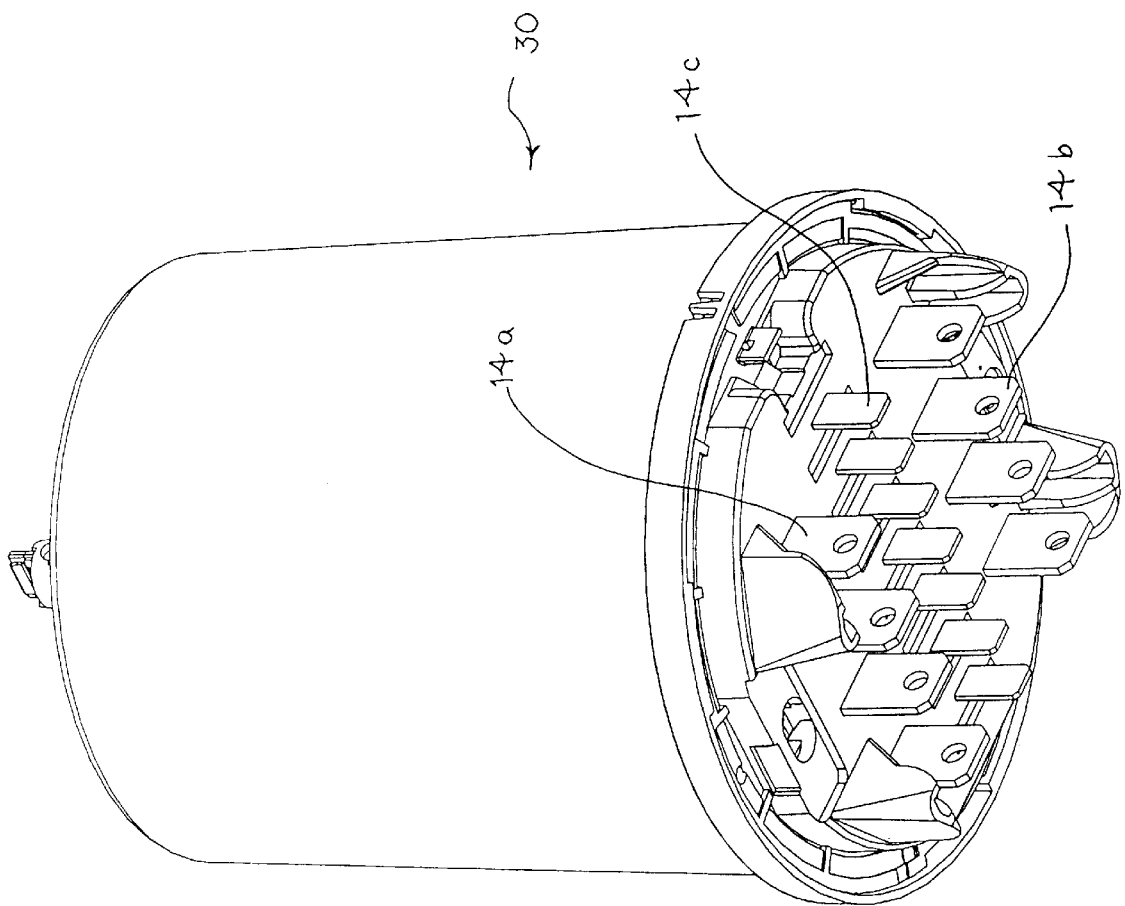
FIG. 6 is a bottom perspective view of the meter of FIG. 5.

Referring now to FIG. 5 and FIG. 6, S-base meters feature blade type terminals 14a, 14b and 14c disposed on backside of the meter. In the embodiment illustrated, the meter 30 includes a row of bayonet or blade terminals 14a and a row of terminals 14b used as current terminals. The meter 30 also includes a row of bayonets 14c which are used in this embodiment as voltage terminals. It will be recognized by those skilled in the art that in other embodiments the blades may be used in other arrangements. For example, depending on the form factor, the bayonets 14b may be used as voltage terminals. The bayonets 14a, 14b and 14c may be used in any other suitable combination of voltage and current terminals or for other purposes. The bayonet terminals 14a, 14b and 14c are designed to mate with matching jaws of a detachable meter-mounting device, such as a revenue meter socket 37. The socket 37 is hard wired to the electrical circuit and is not meant to be removed. A socket-sealing ring 39 is used as a seal between the meter 30 and the meter socket 37 to prevent removal of the meter and to indicate tampering with the meter. To install an S-base meter, the utility need only plug in the meter into the socket. This makes installation of new meters and especially replacement of defective meters extremely simple. Once installed, the installer need only secure the sealing ring 39, which ensures that the meter will not be tampered with (as detailed in the ANSI standards). To remove the meter 30, the installer need only pull it out of the socket 37. The meter includes a cover 31. In an exemplary embodiment, the cover 31 is made of a clear material. The meter 31 also includes a communications port 40, and a graphic user interface, which includes buttons 34a, 34b, and 34c and a display screen 32.

Preferred embodiments

According to one aspect of the present invention, there is provided a connector device comprising a circuit board with at least one opening adapted to receive a bayonet-type electrically conductive blade. Preferably, a solder pad, disposed on at least one side of the circuit board, surrounds the opening. A plurality of vias surrounds the opening and are disposed such that they pass through the solder pad. Vias are thru-holes, preferably plated, that are typically used to provide an electrical connection between layers on a printed circuit board. For purposes of the present invention the vias extend through the board forming a passage between the surfaces of the board. An electrically conducting bayonet is mounted on the circuit board through the opening. The bayonet is attached to the circuit board by solder which surrounds the bayonet on one surface of the circuit board, extends through the opening and plurality of vias and surrounds the bayonet on the opposite surface of the circuit board.

Preferably the bayonets are spaced on the circuit board in a pattern such that the connector device is complementary for use with a socket which is hard wired to the electrical circuit. In such an embodiment, the connector device is designed such that the bayonets align with an aperture on the socket so as to insert therein. Once inserted into the socket, the power supply attached to the socket can be used to supply power to the device. The bayonets are used to receive supply signals to the circuit board (i.e. voltage, current, etc.).

Figure 1:
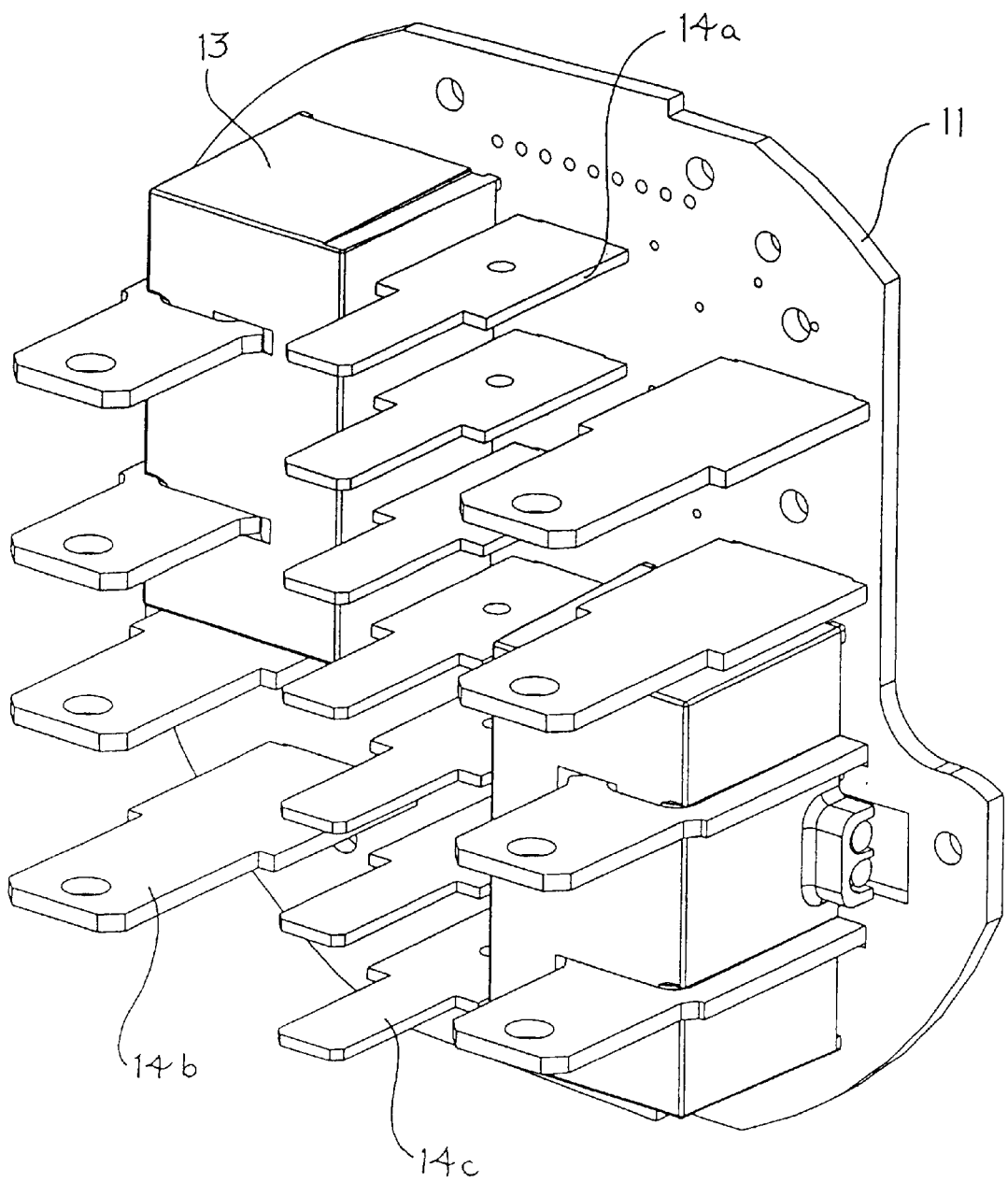
FIG. 1 shows a front perspective view of a preferred embodiment of a connector device of the present invention.

FIG. 1 shows a front perspective view of a connector device comprising a circuit board 11, at least one, and preferably a plurality of, electrically conducting bayonets 14, and an electrical component surrounded by a housing 13. The circuit board 11 is preferably a multi-layered printed circuit board. To improve structural soundness, the circuit board is preferably no less than 0.100 inches thick.

Figure 2:
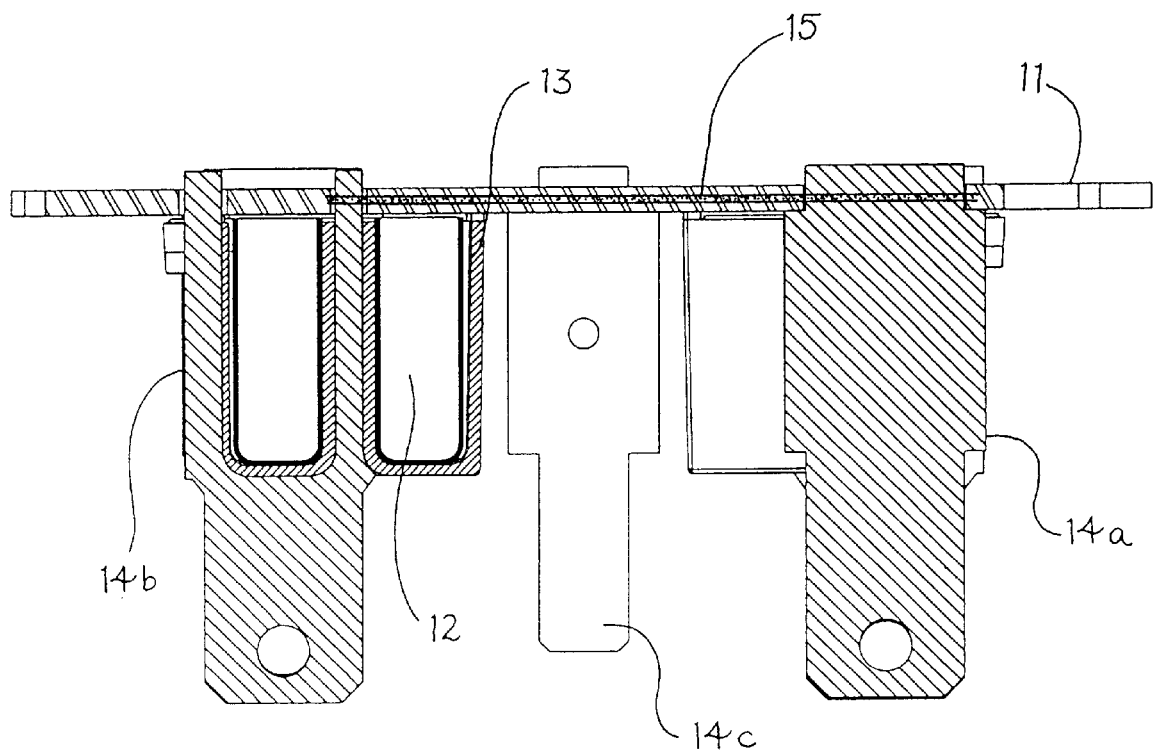
FIG. 2 shows a cross section of the connector device of FIG. 1.

FIG. 2 shows a cross section of a connector device comprising a circuit board 11, two electrically conducting bayonets 14a and 14b, and an electrical component 12 surrounded by a housing 13. In the illustrated embodiment, one of the electrically conducting bayonets 14a straddles the electrical component 12. It will be recognized by those skilled in the art that it is not necessary for the bayonets 14a to straddle the electrical component 12. However, the straddling arrangement adds structural stability to the arrangement. The electrically conducting bayonets 14a and 14b are electrically connected via an electrical connection 15, as described in more detail below. As illustrated, the circuit board includes a plurality of bayonets 14a arranged in a first row on the circuit board and a plurality of bayonets 14b arranged in a second row on the circuit board. Each bayonet in a pair of bayonets 14a and 14b are electrically connected to each other. These two rows of bayonets 14a and 14b may be used, for example, in conjunction with a current transformer. For applications using devices which sense current (i.e. a current transformer) the two bayonets 14a and 14b need to be connected (one as an input blade and one as a return blade). As electricity flows from the power supply through the circuit formed by the electrical connection 15 and the electrically conducting bayonets 14a and 14b, a magnetic field is induced. This induced field can then be detected by the electrical component 12, which is for example a current transformer.

As shown in the figures, the circuit board may also include a set of blades 14c arranged in a row on the circuit board. Each of the bayonets 14c may be used for a supply signal that is a voltage signal.

One distinct advantage of the present device is that by mounting the electrical component 12 with a straddling electrically conducting bayonet 14a, one eliminates the need for other elaborate mounting schemes.

The electrical component 12 is preferably surrounded by a housing 13, which insulates the component from direct contact with the bayonet 14a that carries electric current. The housing can be made of any insulating material, and is preferably plastic. By enclosing the electrical component 12 in a housing 13, one can ensure adequate insulation between the electrically conducting bayonets 14a and the electrical component 12, for example, a current transformer's secondary windings.

Figure 3:
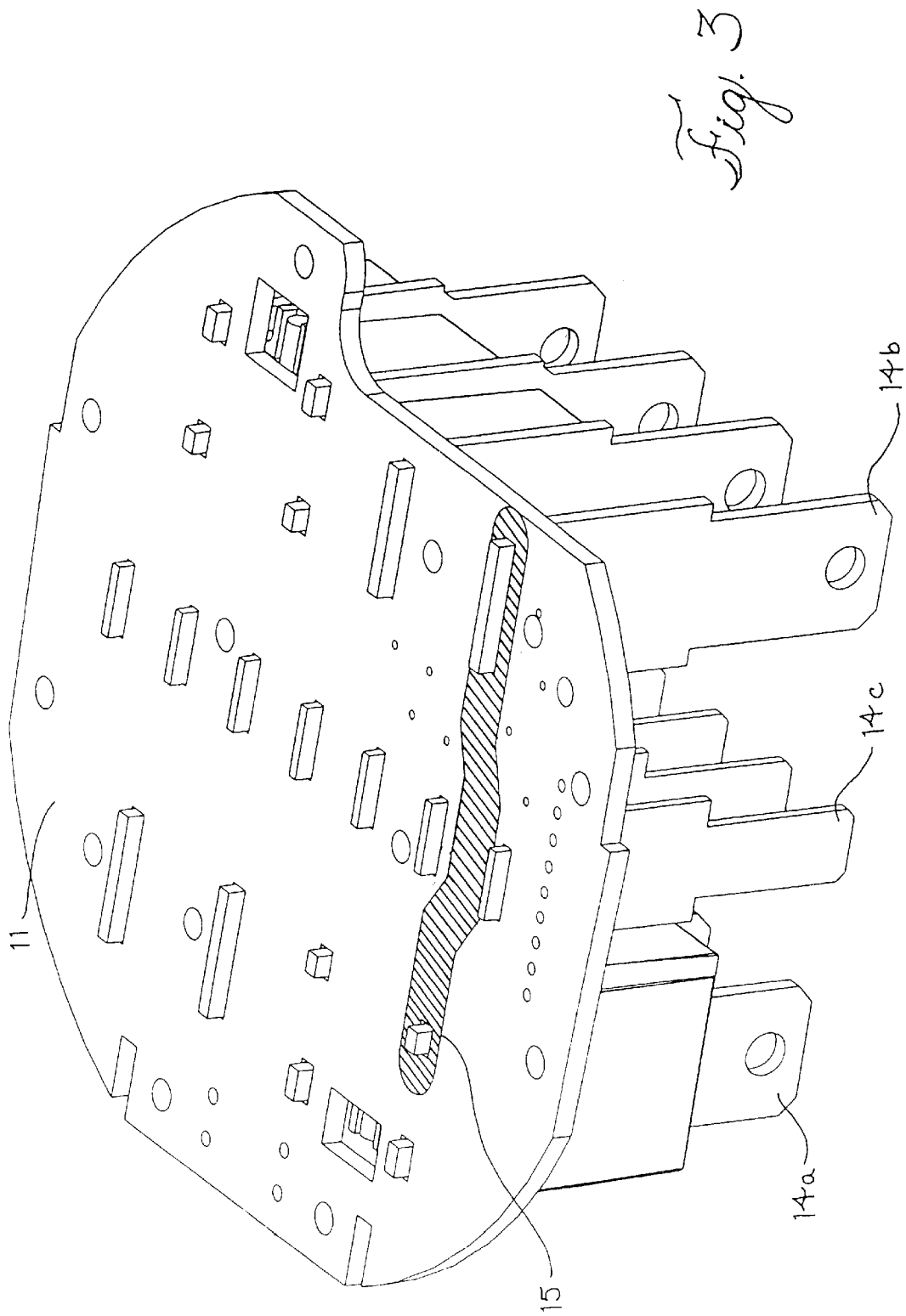
FIG. 3 shows a back perspective view of the connector device of FIG. 1.

FIG. 3 shows a back view of a connector device comprising a circuit board 11, a plurality of electrically conducting bayonets 14. Pairs of electrically conducting bayonets 14a and 14b are electrically connected via an electrical connection 15. The electrically conducting bayonets 14 are inserted through openings in the circuit board 11.

The electrical connection 15 is preferably located within the circuit board 11; for example, between layers of a multi-layered printed circuit board. By so locating the electrical connection 15, one can avoid problems that would otherwise arise if the electrical connection were located externally, in proximity to the electrically conducting bayonets 14.

The preferred type of electrical connection is an electrical trace, especially a copper trace. The trace may be formed on the surface of the circuit board. Preferably, however, the trace is formed on the inner layers of the circuit board. The bond between the copper and the fiberglass layers introduces strength to the connector. Adequate copper thickness and width of current traces need to be maintained to ensure sufficient current carrying capacity. Preferably, multiple redundant traces are run on separate inner layers of the multi-layered printed circuit board to improve current carrying capacity. It will be recognized by those skilled in the art that the connection between two bayonets may comprise other suitable connections. For example, the connection 15 may be a wire or a bar connecting the two bayonets.

Figure 4A:
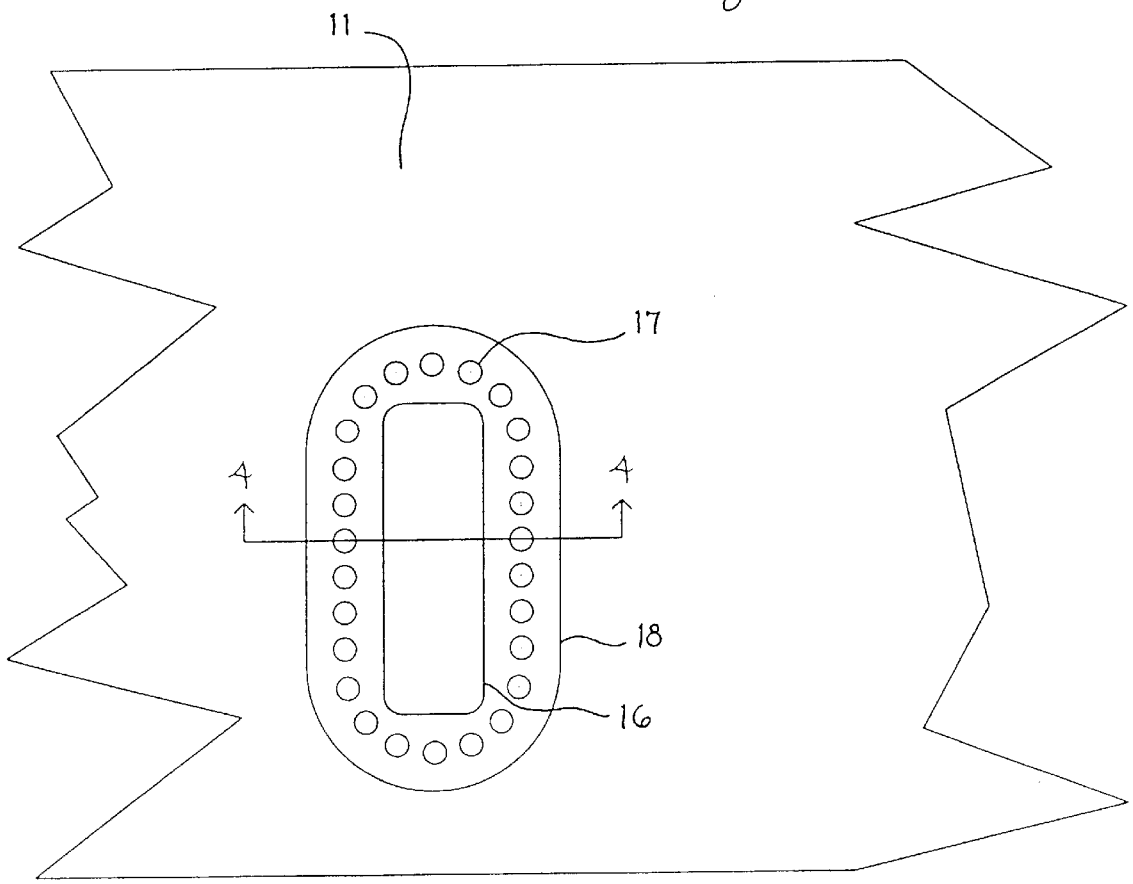
FIG. 4A shows an enlarged view of an opening in the circuit board of FIG. 1.

FIG. 4A shows an enlarged view of an opening 16 in the circuit board 11. The opening 16 is surrounded by a plurality of vias 17. The size of the opening 16 is formed to be slightly larger than the size of the bayonet to be received in the opening 16. Thus, a small gap is defined between the blade and the inner surface of the opening 16. As explained below, the gap between the wall of the opening and the outer wall of the bayonet leaves a gap for solder to flow up through.

Figure 4B:
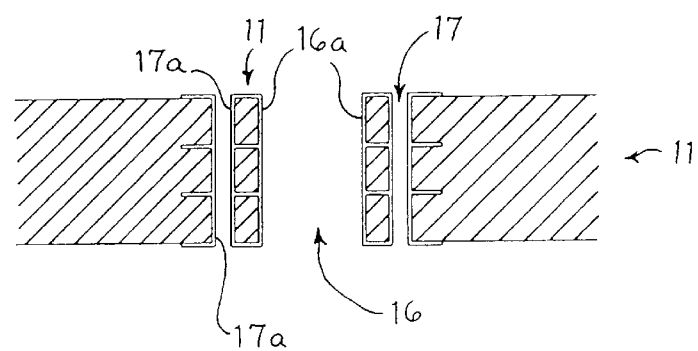
FIG. 4B shows a cross sectional view of the opening in the circuit board of FIG. 1.

FIG. 4B shows a cross section of the circuit board 11 through the opening 16. The vias 17 provide channels surrounding the opening 16 that open to both the top and bottom side of the circuit board. Preferably, a solder pad 18 is formed around the opening 16, on at least one side and preferably on both sides of the circuit board 11. An electrically conducting bayonet 14 is adapted to be inserted into the opening 16.

Figure 4C:
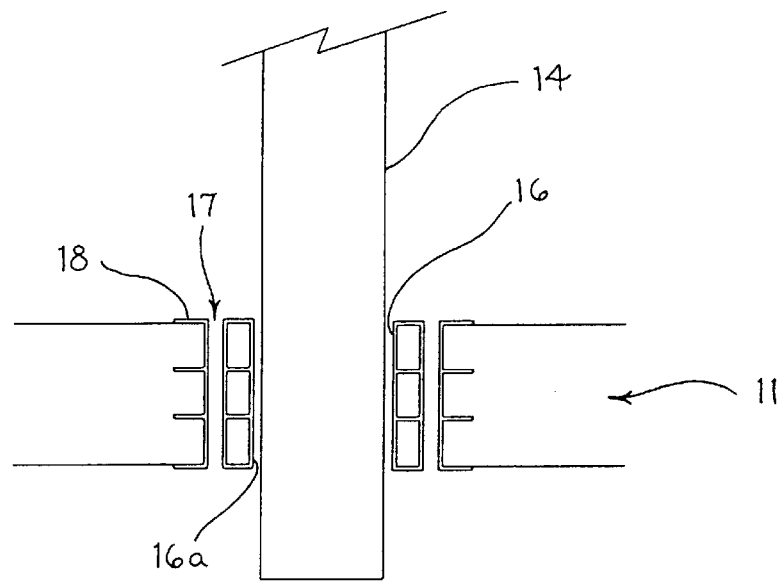
FIG. 4C shows an enlarged cross sectional view of an opening in the circuit board of FIG. 1, with a bayonet mounted in the opening.

Referring now to FIGS. 4B and 4C, the opening 16 is preferably coated or plated with copper, illustrated by the dark lines 16a in FIGS. 4B and 4C. This coating is referred to as thru-hole plating. As illustrated by the dark line in the figure, the vias 17 are also coated with thru-hole plating 17a, preferably also made of copper.

Figure 4D:
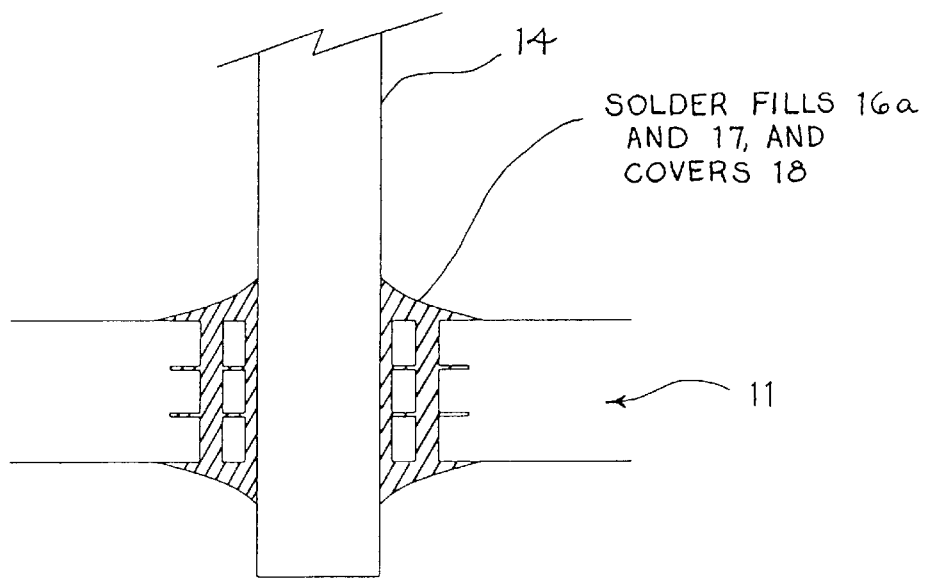
FIG. 4D shows an enlarged cross sectional view of an opening in the circuit board of FIG. 1, with a bayonet mounted in the opening and solder in the connection.

To assemble the blades to the circuit board, a blade 14 is inserted, as illustrated in FIGS. 4C and 4D, in the opening 16. Solder is then applied to the circuit board from one side such that it flows through the gap defined between the opening 16 and the bayonets 14 and through the vias 17. Preferably, the solder flows through the gap to both sides of the circuit board 11 (i.e. to the soldering pads on the surfaces of the circuit board) and through the vias 17 to both sides of the circuit board 11. After the solder cools, a copper coating-solder-blade bond is formed on the inside walls of the opening 16. Preferably, as stated above, the vias also have thru-hole plating to permit the solder to flow up through the vias 17. Once cooled, the solder fills the vias 17, forming a structural bond. FIG. 4D illustrates the bayonet inserted through the opening 16 with solder filling the gap between the opening 16 and the bayonet and also filling the vias 17.

The solder pad(s) 18 may be formed on the surfaces of the circuit board in a manner known in the art. For example, the entire circuit board may be covered with the solder pad material and then the material may be selectively etched away leaving only the pad(s) formed on the circuit board.

The vias can be of any size, but are preferably about 0.018" to 0.100" wide. It will be recognized that the width of the vias is affected by the thickness of the circuit board 11. Functionally, the size of the via must be large enough so that the solder can flow up it and fill the hole after the solder cools, but must be small enough so that the solder does not fall back out of the hole and leave it empty. Typically, the opening 16 is surrounded by at least 2 vias, preferably more than 10 vias. By applying solder through these vias 17, the mechanical strength of the connection of the electrically conducting bayonet to the circuit board is improved.

It will be recognized by those skilled in the art that other methods of attaching the blades using solder may also be used. For example, although it is preferable to use the thru-hole plating in the opening 16, the thru-hole plating can be eliminated if the space between the bayonet and the inside walls of the opening is made large enough. If the gap is large enough, the solder can flow up, through the gap and form a bond with the bayonet and the solder pad 18 on the opposite side from where it originally flowed up through.

Also, it is possible to omit the soldering pad 18 and add solder in another step. For example, the end of the bayonet that is to be inserted into the opening may be dipped into a solder pot and the solder allowed to cool and form a coating. Then a blade is inserted into the opening 16 and the bayonet/board is heated to permit reflow without applying more solder. The solder on the end of the bayonets will reheat and reflow forming a bond.

Also, it is possible to attach the bayonet 14 through the thru-hole without the use of the vias 17. In this embodiment, the solder through the gap formed between the opening and the outer wall of the bayonet would form the attaching structure.

The solder arrangement of this invention can also be used to solder other modules, such as transient suppression devices and the like, to the circuit board 11.

A wave solder machine is preferably used to solder the electrically conducting bayonets to the circuit board. The wave solder machine is used to pass solder through the channels created by the vias 17 through to the opposite side of the circuit board 11.

It is to be understood that a wide range of changes and modifications to the embodiments described above will be apparent to those skilled in the art, and are contemplated. It is therefore intended that the foregoing detailed description be regarded as illustrative rather than limiting, and that it be understood that it is the following claims, including all equivalents that are intended to define the spirit and scope of this invention.

What is claimed is:

1. A connector device for a circuit board comprising:
    a circuit board with at least one opening adapted to receive a bayonet;
    at least one electrically conducting bayonet mounted on the circuit board through said at least one opening;
    a plurality of vias surrounding said at least one opening solder passing through said vias and extending to both sides of;
    said circuit board and to said at least one bayonet.

2. The device of claim 1, wherein a gap is defined between an outer wall of said bayonet and a wall of said at least one opening and further comprising solder passing through said gap and extending to both sides of said circuit board.

3. The device of claim 1, further comprising a second bayonet mounted on said circuit board electrically connected to the other bayonet by an electrical connection.

4. The device of claim 1, wherein the circuit board comprises a multi-layer printed circuit board.

5. The device of claim 4, wherein the circuit board is no less than 0.100 inches thick.

6. The device of claim 1, wherein said at least one opening is thru-hole plated.

7. The device of claim 6, wherein said thru-hole plating comprises copper plating.

8. The device of claim 1, wherein said vias are thru-hole plated.

9. The device of claim 8, wherein said thru-hole plating comprises copper plating.

10. The device of claim 1, comprising a plurality of pairs of electrically conducting bayonets wherein the bayonets in at least some of said pairs are electrically connected by an electrical connection.

11. The device of claim 3, wherein said circuit board comprises a multi-layer circuit board and the electrical connection comprises an electrical trace embedded between at least two layers of said multi-layer printed circuit board.

12. The device of claim 10, wherein said circuit board comprises a multi-layer printed circuit board and wherein a plurality of electrical connections which conduct an electric current between the pairs of electrically conducting bayonets are embedded between multiple layers of the multi-layer printed circuit board.

13. A method of attaching a current or voltage bayonet to a circuit board, comprising:
    providing a circuit board with at least one opening adapted to receive a bayonet;
    forming a plurality of vias around said at least one opening;
    placing an electrically conducting bayonet in said at least one opening; and
    applying solder on one surface of the circuit board, through the vias to the opposite surface of the circuit board and extending to said bayonet.

14. The method of claim 13, wherein the circuit board comprises a multi-layer printed circuit board.

15. The method of claim 13, further comprising the step of forming a solder pad around said opening and wherein the vias are formed through said solder pad.

16. The method of claim 13, comprising the steps of attaching a second electrically conducting bayonet on said circuit board and electrically connecting the two bayonets.

17. The method of claim 13, further comprising the step of thru-hole plating said plurality of vias.

18. The method of claim 16, wherein said circuit board comprises a multi-layer circuit board and said step of electrically connecting said two bayonets comprises embedding the electrical trace between the layers of said multi-layer circuit board.

19. The method of claim 13, wherein a gap is defined between said bayonet and said at least one opening and further comprising the step of applying solder around said bayonet and through said gap.

20. The method of claim 19, further comprising the step of thru-hole plating said at least one opening.

21. In an electrical meter for sensing electrical parameters from an electric circuit, said meter including bayonets disposed on said meter, said bayonets mateable with matching jaws of a detachable meter mounting device, said bayonets used to receive voltage and current signals from the electric circuit to the meter, and one or more sensors coupled with said electric circuit and operative to sense one or more electrical parameters in said electric circuit and generate one or more analog signals indicative of said electrical parameters, said meter comprising:
    a circuit board with a plurality of openings each adapted to receive a bayonet;
    a plurality of electrically conducting bayonets mounted on the circuit board through said openings to define as at least one of a voltage and a current bayonet, wherein a gap is defined between said openings and said bayonets;
    solder passing through said gap and extending to both sides of said circuit board; and
    an electrical sensor connected to at least one of said bayonets.

22. The meter of claim 21 further comprising a plurality of vias disposed around at least one of said plurality of openings and solder passing through said vias and extending to both sides of said circuit board and extending to the bayonet in said at least one opening.

23. The meter of claim 22 further comprising a solder pad on one at least side of said circuit board and wherein said vias pass through said solder pad.

24. The meter of claim 21, further comprising an electrical connection between at least two of said bayonets.

25. The meter of claim 21, wherein the circuit board comprises a multi-layer printed circuit board.

26. The meter of claim 25, wherein the circuit board is no less than 0.100 inches thick.

27. The meter of claim 21, wherein at least two of the bayonets are electrically connected by an electrical connection.

28. The meter of claim 27, wherein said circuit board comprises a multi-layer circuit board and the electrical connection comprises an electrical trace embedded between at least two layers of said multi-layer printed circuit board.

29. The meter of claim 28, wherein a plurality of electrical connections which conduct an electric current between the pair of electrically conducting bayonets are embedded between multiple layers of the multi-layer printed circuit board.

30. A connector device for a circuit board comprising,
    a circuit board with at least one opening adapted to receive a bayonet;

at least one electrically conducting bayonet mounted on the circuit board through said at least one opening, wherein a gap is defined between said at least one opening and said bayonet;

a plurality of vias surrounding said opening;

solder passing through said vias and extending to both sides of said circuit board through said vias and passing through said gap and extending to both sides of said circuit board through said gap and said solder extending to said bayonet.

31. The device of claim 30, further comprising a second bayonet mounted on said circuit board electrically connected to the other bayonet by an electrical connection.

32. The device of claim 30, wherein the circuit board comprises a multi-layer printed circuit board.

33. The device of claim 32, wherein the circuit board is no less than 0.100 inches thick.

34. The device of claim 30, wherein said at least one opening and said vias are thru-hole plated.

35. The device of claim 30, comprising a plurality of pairs of electrically conducting bayonets wherein the bayonets in at least some of said pairs are electrically connected by an electrical connection.

36. The device of claim 35, wherein said circuit board comprises a multi-layer circuit board and the electrical connection comprises an electrical trace embedded between at least two layers of the multi-layer printed circuit board.

37. The device of claim 35, wherein said circuit board comprises a multi-layer printed circuit board and wherein a plurality of electrical connections which conduct an electric current between the pairs of electrically conducting bayonets are embedded between multiple layers of said multilayer printed circuit board.

38. The device of claim 30 further comprising a solder pad formed on at least one side of said circuit board around said at least one opening, wherein said vias pass through said solder pad.

39. In an electrical meter for sensing electrical parameters from an electric circuit, said meter including bayonet terminals disposed on said meter mateable with matching jaws of a detachable meter mounting device, said bayonet terminals used to receive signals from the electric circuit to the meter, and one or more sensors coupled with said electric circuit and operative to sense one or more electrical parameters in said electric circuit and generate one or more analog signals indicative of said electrical parameters, said meter comprising:

a circuit board with at least one opening adapted to receive a bayonet;

at least one electrically conducting bayonet mounted on the circuit board through said at least one opening, wherein a gap is defined between said at least one opening and said bayonet;

a plurality of vias formed around said opening;

solder passing through said vias and extending to both sides of said circuit board through said vias and passing through said gap and extending to both sides of said circuit board through said gap and said solder extending to said bayonet; and an electrical sensor connected to said at least one electrically conducting bayonet.

40. The meter of claim 39, further comprising a second bayonet mounted on said circuit board electrically connected to the other bayonet by an electrical connection.

41. The meter of claim 39, wherein the circuit board comprises a multi-layer printed circuit board.

42. The meter of claim 41, wherein the circuit board is no less than 0.100 inches thick.

43. The meter of claim 39, comprising a plurality of pairs of electrically conducting bayonets wherein the bayonets in at least some of said pairs are electrically connected by an electrical connection.

44. The device of claim 40, wherein said circuit board comprises a multi-layer circuit board and said electrical connection comprises an electrical trace embedded between at least two layers of said multi-layer printed circuit board.

45. The device of claim 43, wherein said circuit board comprises a multi-layer printed circuit board and wherein a plurality of electrical connections which conduct an electric current between the pair of electrically conducting bayonets are embedded between multiple layers of said multilayer printed circuit board.

46. The device of claim 39, further comprising a solder pad formed on at least one side of said circuit board around said at least one opening and wherein said vias pass through said solder pad.

47. The device of claim 39, wherein said at least one opening is thru-hole plated.

48. The device of claim 39, wherein said vias are thru-hole plated.

* * * * *

UNITED STATES PATENT AND TRADEMARK OFFICE
CERTIFICATE OF CORRECTION

PATENT NO. : 6,186,842 B1  Page 1 of 1
DATED : February 13, 2001
INVENTOR(S) : Markus F. Hirschbold et al.

It is certified that error appears in the above-identified patent and that said Letters Patent is hereby corrected as shown below:

Claim 1,
Line 8, change "sides of;" to -- sides of --.

Claim 37,
Line 5, change "multilayer" to -- multi-layer --.

Claim 45,
Line 5, change "multilayer" to -- multi-layer --.

Signed and Sealed this

Thirtieth Day of October, 2001

Attest:

*Nicholas P. Godici*

NICHOLAS P. GODICI
*Attesting Officer*     *Acting Director of the United States Patent and Trademark Office*

(12) EX PARTE REEXAMINATION CERTIFICATE (7149th)
United States Patent
Hirschbold et al.

(10) Number: US 6,186,842 C1
(45) Certificate Issued: *Nov. 10, 2009

(54) REVENUE METER BAYONET ASSEMBLY AND METHOD OF ATTACHMENT

(75) Inventors: Markus F. Hirschbold, British Columbia (CA); Peter C. Cowan, British Columbia (CA)

(73) Assignee: Power Measurement Ltd., Saanichton, British Columbia (CA)

Reexamination Request:
No. 90/008,873, Oct. 9, 2007

Reexamination Certificate for:
Patent No.: 6,186,842
Issued: Feb. 13, 2001
Appl. No.: 09/370,686
Filed: Aug. 9, 1999

(*) Notice: This patent is subject to a terminal disclaimer.

Certificate of Correction issued Oct. 30, 2001.

(51) Int. Cl.
*H01R 04/02* (2006.01)

(52) U.S. Cl. .................. 439/876; 361/664; 228/180.1
(58) Field of Classification Search .................. None
See application file for complete search history.

(56) References Cited

U.S. PATENT DOCUMENTS

| | | | |
|---|---|---|---|
| 2,105,396 A | 1/1938 | Bakke | |
| 2,902,629 A | 9/1959 | Little | |
| 3,002,481 A | 10/1961 | Hutters | |
| 3,355,630 A | 11/1967 | Orr | |
| 3,391,384 A | 7/1968 | Hughes | |
| 3,541,225 A | 11/1970 | Raciti | |
| 3,780,433 A | 12/1973 | Lynch | |
| 3,796,953 A | 3/1974 | Zisa et al. | |
| 3,915,546 A | 10/1975 | Cobaugh | |
| 3,943,413 A | 3/1976 | Keever | |
| 3,991,347 A | 11/1976 | Hollyday | |
| 4,034,290 A | 7/1977 | Warren | |
| 4,050,621 A | 9/1977 | Bouley | |
| 4,072,385 A | 2/1978 | Wallner | |
| 4,092,592 A | 5/1978 | Milkovic | |
| 4,121,147 A | 10/1978 | Becker et al. | |
| 4,259,746 A | 3/1981 | Sandstedt | |
| 4,264,960 A | 4/1981 | Gurr | |
| 4,298,839 A | 11/1981 | Johnston | |
| 4,393,438 A | 7/1983 | Schelhorn | |

(Continued)

FOREIGN PATENT DOCUMENTS

| | | |
|---|---|---|
| CA | 2299044 | 2/2001 |
| DE | 3636817 | 5/1988 |
| JP | 6-21603 | 1/1994 |
| JP | 6-61630 | 3/1994 |
| JP | 08-34263 | 2/1996 |
| WO | WO 01/01079 | 1/2001 |

OTHER PUBLICATIONS

Clark, "Printed Circuit Engineering: Optimizing for Manufacturability," 1989, pp. 34–35, 38–40, 183.
Canadian Office Action for Application No. 2,300,256, Power Measurement Ltd., "External Communications Interface for Revenue Meter," Dec. 15, 2004, 3 pages.

(Continued)

*Primary Examiner*—Glenn K. Dawson

(57) ABSTRACT

A method and arrangement are disclosed for attaching one or more electrical bayonet-type blades to a circuit board. The arrangement comprises a circuit board with at least one opening adapted to receive one blade. A solder pad disposed on at least one surface of board surrounds the opening. A plurality of vias surround the opening. The vias are disposed such that they pass through the solder pad. Solder is applied around the electrically conducting bayonet on one surface of the circuit board, through the vias, and around the electrically conducting bayonet of the surface of the circuit board opposite to the solder pad.

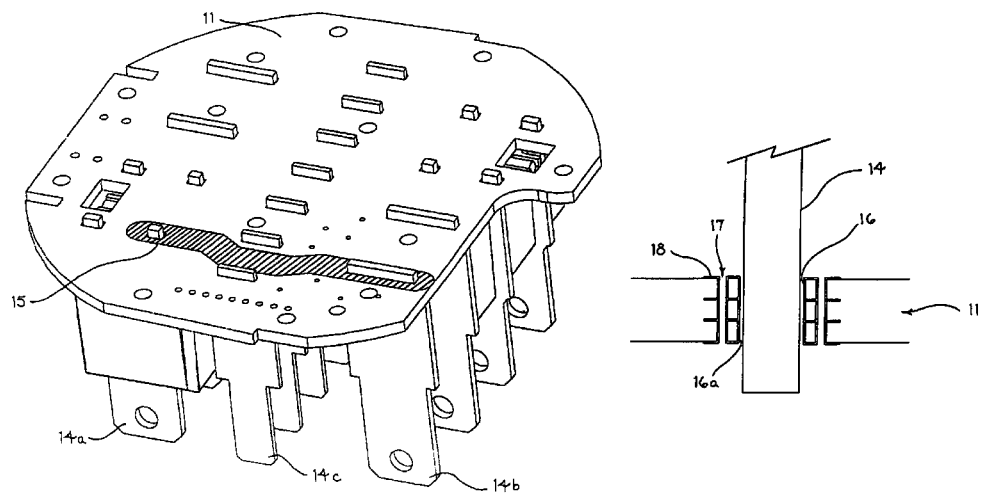

U.S. PATENT DOCUMENTS

| | | |
|---|---|---|
| 4,400,783 A | 8/1983 | Locke, Jr. et al. |
| 4,455,612 A | 6/1984 | Girgis |
| 4,477,970 A | 10/1984 | Alexander |
| 4,542,469 A | 9/1985 | Brandyberry et al. |
| 4,571,691 A | 2/1986 | Kennon |
| 4,592,137 A | 6/1986 | Tanaka |
| 4,744,004 A | 5/1988 | Hammond |
| 4,839,819 A | 6/1989 | Begin et al. |
| 4,843,311 A | 6/1989 | Rozman et al. |
| 4,851,614 A | 7/1989 | Duncan, Jr. |
| 4,886,981 A | 12/1989 | Lentini |
| 4,959,607 A | 9/1990 | Coryea et al. |
| 5,012,301 A | 4/1991 | Xu |
| 5,021,763 A | 6/1991 | Obear |
| 5,207,595 A | 5/1993 | Learmont et al. |
| 5,229,713 A | 7/1993 | Bullock et al. |
| 5,233,131 A | 8/1993 | Liang |
| 5,271,548 A | 12/1993 | Maiwald |
| 5,326,937 A | 7/1994 | Watanabe |
| 5,364,290 A | 11/1994 | Hartman |
| 5,385,486 A | 1/1995 | Robinson |
| 5,390,078 A | 2/1995 | Taylor |
| 5,402,314 A | 3/1995 | Amago |
| 5,412,166 A | 5/1995 | Krupp |
| 5,414,223 A | 5/1995 | Suski |
| 5,514,953 A | 5/1996 | Schultz |
| 5,514,959 A | 5/1996 | Horan et al. |
| 5,530,846 A | 6/1996 | Strong |
| 5,539,304 A | 7/1996 | Payne |
| 5,548,209 A | 8/1996 | Lusignan et al. |
| 5,556,308 A | 9/1996 | Brown |
| 5,567,181 A | 10/1996 | Lentz |
| 5,571,031 A | 11/1996 | Robinson et al. |
| 5,600,526 A | 2/1997 | Russell et al. |
| 5,620,337 A | 4/1997 | Pruehs |
| 5,646,373 A * | 7/1997 | Collins et al. ............... 174/252 |
| 5,650,936 A | 7/1997 | Loucks et al. |
| 5,661,623 A | 8/1997 | McDonald |
| 5,704,535 A | 1/1998 | Thompson, Sr. |
| 5,715,438 A | 2/1998 | Silha |
| 5,742,512 A | 4/1998 | Edge et al. |
| 5,745,114 A | 4/1998 | King et al. |
| 5,774,336 A | 6/1998 | Larson |
| 5,834,932 A | 11/1998 | May |
| 5,861,742 A | 1/1999 | Miller |
| 5,862,391 A | 1/1999 | Salas et al. |
| 5,930,117 A | 7/1999 | Gengel |
| 5,933,004 A | 8/1999 | Jackson |
| 5,958,060 A | 9/1999 | Premerlani |
| 5,973,481 A | 10/1999 | Thompson |
| 5,995,911 A | 11/1999 | Hart |
| 6,000,034 A | 12/1999 | Lightbody et al. |
| 6,008,711 A | 12/1999 | Bolam |
| 6,015,314 A | 1/2000 | Benfante |
| 6,018,700 A | 1/2000 | Edel |
| 6,043,642 A | 3/2000 | Martin et al. |
| 6,043,986 A | 3/2000 | Kondo |
| 6,049,791 A | 4/2000 | Lerner |
| 6,124,806 A | 9/2000 | Cunningham et al. |
| 6,177,884 B1 | 1/2001 | Hunt et al. |
| 6,186,842 B1 | 2/2001 | Hirschbold et al. |
| 6,236,949 B1 | 5/2001 | Hart |
| 6,271,523 B1 | 8/2001 | Weaver et al. |
| 6,304,517 B1 | 10/2001 | Ledfelt |
| 6,316,932 B1 | 11/2001 | Horan et al. |
| 6,429,785 B1 | 8/2002 | Griffin et al. |
| 6,561,844 B1 | 5/2003 | Johnson |
| 6,615,147 B1 | 9/2003 | Jonker et al. |
| 6,734,633 B2 | 5/2004 | Fye et al. |
| 6,734,663 B2 | 5/2004 | Fye et al. |
| 6,983,211 B2 | 1/2006 | Macfarlene et al. |

OTHER PUBLICATIONS

Hwang, Jennie S.; Modern Solder Technology for Competitive Electronics Manufacturing (1996).

Judd, Mike & Brindley, Keith; Soldering in Electronics Assembling (1992).

Lambert, Leo P.; Soldering for Electronic Assemblies (1988).

Lau, John H. Solder Joint Reliability: Theory and Applications (1991).

Manko, Howard H.; Soldering Handbook for Printed Circuits and Surface Mounting (2d ed. 1995).

Manko, Howard H.; Solders and Soldering (2d ed. 1979).

Quantum® Q1000 "Sandy Creek Plant Lonworks® Communication" brochure, © Copyright 1997 Schlumberger Industries, Inc., MK/1662/9–97, pp. 1–4.

Rahn, Armin; The Basics of Soldering (1993).

Schlumberger Electricity "One of your largest customers is concerned about power quality. . . " brochure, © Copyright 1996 Schlumberger Industries, Inc., Pp1633/6–96m pp. 1–5.

Singman, Andrew; Modern Electronics Soldering Techniques (2000).

Smith, H. Ted; Quality Hand Soldering and Circuit Board Repair (1994).

GE Ku2™ *Malfunction Meter,* Product Description, Operating Instructions, Maintenance Instructions, Upgrading, Site Analysis Guides, Diagrams, pp. 1–1–2–32, Dec. 2000.

Schlumberger "Quantum® Q100 Multimeasurement Meter Technical Reference Guide," Effective Oct. 1999, © Copyright 1999, Schlumberger Resource Management Services, Inc.

* cited by examiner

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 21–48 is confirmed.

Claims 2 and 19 are cancelled.

Claims 1, 13 and 20 are determined to be patentable as amended.

Claims 3–12 and 14–18, dependent on an amended claim, are determined to be patentable.

New claim 49 is added and determined to be patentable.

1. A connector device for a circuit board comprising:
   a circuit board with at least one opening adapted to receive a bayonet;
   at least one electrically conducting bayonet mounted on the circuit board through said at least one opening;
   a plurality of vias surrounding said at least one opening solder passing through said vias and extending to both sides of said circuit board and to said at least one bayonet,
   *wherein a gap is defined between an outer wall of said bayonet and a wall of said at least one opening and further comprising solder passing through said gap and extending to both sides of said circuit board.*

13. A method of attaching a current or voltage bayonet to a circuit board, comprising:
    providing a circuit board with at least one opening adapted to receive a bayonet;
    forming a plurality of vias around said at least one opening;
    placing an electrically conducting bayonet in said at least one opening; and
    applying solder on one surface of the circuit board, through the vias to the opposite surface of the circuit board and extending to said bayonet,
    *wherein a gap is defined between said bayonet and said at least one opening and further comprising applying solder around said bayonet and through said gap.*

20. The method of [claim 19,] *claim 13,* further comprising the step of thru-hole plating said at least one opening.

*49. The device of claim 1, wherein the circuit board comprises a first side and a second side, the at least one opening extending therebetween, the at least one electrically conducting bayonet being inserted through said at least one opening so as to extend beyond the first and second sides of the circuit board.*

* * * * *